United States Patent
Storm et al.

(10) Patent No.: US 10,641,653 B2
(45) Date of Patent: May 5, 2020

(54) APPARATUS FOR DETECTING ILLUMINATION LEVELS

(71) Applicant: STMICROELECTRONICS (RESEARCH & DEVELOPMENT) LIMITED, Marlow (GB)

(72) Inventors: Graeme Storm, Kirkliston (GB); John Kevin Moore, Edinburgh (GB)

(73) Assignee: STMICROELECTRONICS (RESEARCH & DEVELOPMENT) LIMITED, Marlow (GB)

(*) Notice: Subject to any disclaimer, the term of this patent is extended or adjusted under 35 U.S.C. 154(b) by 250 days.

(21) Appl. No.: 15/464,563

(22) Filed: Mar. 21, 2017

(65) Prior Publication Data

US 2018/0058924 A1    Mar. 1, 2018

(30) Foreign Application Priority Data

Aug. 25, 2016  (EP) .................................... 16185753

(51) Int. Cl.
| | |
|---|---|
| *G01J 1/42* | (2006.01) |
| *G01T 1/24* | (2006.01) |
| *G01S 7/4863* | (2020.01) |
| *G01J 1/44* | (2006.01) |
| *G01J 1/02* | (2006.01) |
| *G01S 7/497* | (2006.01) |
| *H01L 31/107* | (2006.01) |

(52) U.S. Cl.
CPC ........... *G01J 1/4204* (2013.01); *G01J 1/0228* (2013.01); *G01J 1/44* (2013.01); *G01S 7/4863* (2013.01); *G01S 7/497* (2013.01); *G01T 1/248* (2013.01); *H01L 31/107* (2013.01); *G01J 2001/442* (2013.01); *G01J 2001/4466* (2013.01)

(58) Field of Classification Search
CPC .......... G01J 1/4204; G01J 1/0228; G01J 1/44; G01J 2001/4466; G01J 2001/442; G01S 7/4863; G01S 7/497; G01T 1/248; H01L 31/107

See application file for complete search history.

(56) References Cited

U.S. PATENT DOCUMENTS

| | | | |
|---|---|---|---|
| 10,107,766 B2* | 10/2018 | Abraham ............. | G01N 23/087 |
| 2005/0218299 A1* | 10/2005 | Olsen ....................... | H03F 3/08 |
| | | | 250/214 A |
| 2006/0027736 A1* | 2/2006 | Ichino ............... | H01L 31/02027 |
| | | | 250/214 R |
| 2010/0214654 A1 | 8/2010 | Birk et al. | |
| 2012/0205522 A1 | 8/2012 | Richardson et al. | |

(Continued)

FOREIGN PATENT DOCUMENTS

WO    2016003451 A1    1/2016

*Primary Examiner* — Kevin K Pyo
*Assistant Examiner* — Don J Williams
(74) *Attorney, Agent, or Firm* — Slater Matsil, LLP

(57) ABSTRACT

An apparatus includes a single photon avalanche diode pixel that includes a single photon avalanche diode and an output transistor configured to provide an analog output current from the single photon avalanche diode. The single photon avalanche diode pixel is configured to operate in a first mode to output a digital single photon detection event. The single photon avalanche diode pixel is further configured to operate in a second mode to output the analog output current indicating a level of illumination of the pixel.

22 Claims, 11 Drawing Sheets

(56) References Cited

U.S. PATENT DOCUMENTS

2013/0300838 A1* 11/2013 Borowski .............. G01S 7/486
 348/46
2016/0231168 A1 8/2016 Guo et al.

* cited by examiner

Compensation within pixel

Compensation external to array

APPARATUS FOR DETECTING ILLUMINATION LEVELS

CROSS-REFERENCE TO RELATED APPLICATIONS

This application claims priority to European Patent Application No. 16185753.7, filed on Aug. 25, 2016, which application is hereby incorporated herein by reference.

TECHNICAL FIELD

Some embodiments relate to an apparatus and in particular but not exclusively to an apparatus for detecting illumination levels using an array of photosensitive devices.

BACKGROUND

Single photon avalanche diodes (SPAD) may be used as a detector of reflected light. In general, an array of pixels including SPAD sensing elements is provided as a sensor in order to detect a reflected light pulse. A photon may generate a carrier in the SPAD through the photo electric effect. The photo generated carrier may trigger an avalanche current in one or more of the SPADs in an SPAD array. The avalanche current may signal an event, namely that a photon of light has been detected.

The use of SPAD arrays for ranging is well known. For example SPAD arrays and SPAD sensors have been used to determine time-of-flight distances for ranging applications in mobile devices.

Current SPAD arrays and SPAD sensors although able to determine a single avalanche event are not able to efficiently produce outputs for determining levels of illumination in short time windows. The requirement to increase fill factor is at odds with the requirement to digitally counts events in parallel from all pixels. The digital nature of the SPAD output makes the accumulation of multiple events within a short timeframe highly processing intensive. This places a limit on the maximum light level which can be detected with reasonable levels of digital logic and processing. In turn, this makes adoption of the technology within applications where determining a level of illumination is useful, such as in amplitude modulation communications, relatively complex.

SUMMARY

According to some embodiments there is provided an apparatus that includes at least one single photon avalanche diode pixel configured to operate in a first mode to output a digital single photon detection event. The pixel comprises a single photon avalanche diode, and at least one output transistor configured to provide an analog output current from the single photon avalanche diode, such that the at least one single photon avalanche diode pixel is further configured to operate in a second mode to output the analog output current indicating a level of illumination of the pixel.

The at least one single photon avalanche diode may be configured to operate in the first mode and second mode at different times or substantially the same time.

The at least one output transistor may be configured to provide the analog output current to an input of a trans-impedance amplifier.

The apparatus may comprise multiple single photon avalanche diode pixels configured to provide an analog output current from each single photon avalanche diode to the input of the trans-impedance amplifier.

The apparatus may further comprising a pulse conditioner configured to receive a single photon detection event signal pulse and control the at least one output transistor to output the analog output current indicating a level of illumination of the pixel based on a modified length single photon detection event signal pulse. A modified length single photon detection event signal pulse may be a reduced length single photon detection event signal pulse.

The apparatus may further comprise a current averager to determine an average analog output current, wherein the average analog output current indicates an ambient level of illumination of the pixel.

The current averager may comprise a low pass filter.

The apparatus may further comprise a current compensator configured to subtract the average analog output current from the analog output current such that the level of illumination of the pixel is an indication of the level of illumination above the ambient level of illumination of the pixel.

The current compensator may comprise at least one of: a controllable current drain located external to the pixel and coupled to an output of the output transistor; and at least one transistor coupled to an anode of the diode and configured to controllably drain the current from the diode.

The single photon avalanche diode may be configured to operate in a Geiger mode of operation in the first mode and in a photodiode mode of operation in the second mode.

The single photon avalanche diode pixel may comprise a diode voltage supply coupled to a cathode of the diode, wherein the diode voltage supply is: a first voltage level above a Geiger mode voltage of the diode when the diode is configured to operate in the Geiger mode of operation; and a second voltage level below the Geiger mode voltage when the diode is configured to operate in the photodiode mode of operation.

The at least one output transistor may comprise at least one of: at least one quench transistor coupled to an anode of the diode and configured to drain the avalanche current following a detection event; at least one pull up transistor coupled to the anode of the diode and configured to enable the potential of the anode of the diode to be pulled up to an further supply voltage; and at least one output transistor coupled to the anode of the diode and configured to enable an output of the digital single photon detection event.

The output transistor may comprise a resistor and a series MOS switch.

When the output transistor comprises the at least one quench transistor coupled to the anode of the diode and configured to drain the avalanche current following a detection event, the quench transistor may be selectively enabled when the pixel is operated in the first mode.

The quench transistor may have a separate dedicated ground line in order to sink the current from the photodiode caused by a diode breakdown current.

When the quench transistor is selectively enabled a quench transistor gate terminal may be operated at a high voltage to reduce the impedance of the output transistor.

The output transistor may be configured to be selectively enabled when the pixel is operated in the first mode and disabled when the pixel is operated in the second mode.

The apparatus may comprise at least two rows of the at least one single photon avalanche diode pixel, wherein at least one row is configured to operate in the first mode and at least one further row is configured to operate in the second row substantially at the same time.

According to a second aspect there is provided a method for operating a single photon avalanche diode pixel comprising a single photon avalanche diode and at least one output transistor, the method comprising: configuring the at least one single photon avalanche diode pixel to operate in a first mode to output a digital single photon detection event; and configuring the at least one single photon avalanche diode pixel to operate in a second mode by configuring the output transistor to provide an analog output current from the single photon avalanche diode indicating a level of illumination of the pixel.

Configuring the at least one single photon avalanche diode pixel may comprise configuring the at least one single photon avalanche diode to operate in the first mode and second mode at one of: different times and substantially the same time.

Configuring the output transistor to provide an analog output current from the single photon avalanche diode may comprise providing to an input of a trans-impedance amplifier the analog output current from the at least one output transistor.

Providing to an input of a trans-impedance amplifier the analog output current from the at least one output transistor may comprise providing the analog output current from multiple single photon avalanche diode pixels to the input of the trans-impedance amplifier.

The method may further comprise: modifying the pulse length of a single photon detection event signal pulse; and controlling the at least one output transistor to output the analog output current indicating a level of illumination of the pixel based on the modified length single photon detection event signal pulse. A modified length single photon detection event signal pulse may be a reduced length single photon detection event signal pulse.

The method may further comprise determining an average analog output current indicating an ambient level of illumination of the pixel.

The method may further comprise compensating for the ambient level of illumination of the pixel by removing the average analog output current from the analog output current such that the level of illumination of the pixel is an indication of the level of illumination above the ambient level of illumination of the pixel.

Removing the average analog output current from the analog output current such that the level of illumination of the pixel is an indication of the level of illumination above the ambient level of illumination of the pixel may comprise at least one of: removing the average analog output current from the analog output current using a controllable current drain located external to the pixel and coupled to an output of the output transistor; and removing the average analog output current from the analog output current using at least one transistor coupled to an anode of the diode and configured to controllably drain the current from the diode.

The method may further comprise operating the single photon avalanche diode in a Geiger mode of operation in the first mode and in a photodiode mode of operation in the second mode.

The method may further comprise coupling a diode voltage supply to a cathode of the diode, wherein the diode voltage supply may be: a first voltage level above a Geiger mode voltage of the diode when the diode is configured to operate in the Geiger mode of operation; and a second voltage level below the Geiger mode voltage when the diode is configured to operate in the photodiode mode of operation.

According to a third aspect there is provided an apparatus for operating a single photon avalanche diode pixel comprising a single photon avalanche diode and at least one output transistor, the apparatus comprising: means for configuring the at least one single photon avalanche diode pixel to operate in a first mode to output a digital single photon detection event; and means for configuring the at least one single photon avalanche diode pixel to operate in a second mode by configuring the output transistor to provide an analog output current from the single photon avalanche diode indicating a level of illumination of the pixel.

The means for configuring the at least one single photon avalanche diode pixel may comprise means for configuring the at least one single photon avalanche diode to operate in the first mode and second mode at one of: different times and substantially the same time.

The means for configuring the output transistor to provide an analog output current from the single photon avalanche diode may comprise means for providing to an input of a trans-impedance amplifier the analog output current from the at least one output transistor.

The means for providing to an input of a trans-impedance amplifier the analog output current from the at least one output transistor may comprise means for providing the analog output current from multiple single photon avalanche diode pixels to the input of the trans-impedance amplifier.

The apparatus may further comprise: means for modifying the pulse length of a single photon detection event signal pulse; and means for controlling the at least one output transistor to output the analog output current indicating a level of illumination of the pixel based on the modified length single photon detection event signal pulse. A modified length single photon detection event signal pulse may be a reduced length single photon detection event signal pulse.

The apparatus may further comprise means for determining an average analog output current indicating an ambient level of illumination of the pixel.

The apparatus may further comprise means for compensating for the ambient level of illumination of the pixel by removing the average analog output current from the analog output current such that the level of illumination of the pixel is an indication of the level of illumination above the ambient level of illumination of the pixel.

The means for removing the average analog output current from the analog output current such that the level of illumination of the pixel is an indication of the level of illumination above the ambient level of illumination of the pixel may comprise at least one of: means for removing the average analog output current from the analog output current using a controllable current drain located external to the pixel and coupled to an output of the output transistor; and means for removing the average analog output current from the analog output current using at least one transistor coupled to an anode of the diode and configured to controllably drain the current from the diode.

The apparatus may further comprise means for operating the single photon avalanche diode in a Geiger mode of operation in the first mode and in a photodiode mode of operation in the second mode.

The apparatus may further comprise means for coupling a diode voltage supply to a cathode of the diode, wherein the diode voltage supply may be: a first voltage level above a Geiger mode voltage of the diode when the diode is configured to operate in the Geiger mode of operation; and a second voltage level below the Geiger mode voltage when the diode is configured to operate in the photodiode mode of operation.

BRIEF DESCRIPTION OF THE DRAWINGS

Some embodiments will now be described by way of example only and with reference to the accompanying figures in which.

DETAILED DESCRIPTION OF ILLUSTRATIVE EMBODIMENTS

The concept as embodied herein is apparatus and methods for reconfiguring a typical SPAD pixel arrangement such that it is able to produce in a further mode of operation a suitable analog current or voltage output. The suitable analog current or voltage output may be used to both indicate a level of illumination of the pixel in addition to providing additional TOF information.

This reconfiguration of the SPAD pixel is useful for many different applications. For example it enables the SPAD pixel, and thus the SPAD pixel array and SPAD sensor to be used to determine not only the digital detection of single photon events which can be used for time-of-flight estimation and thus range estimation but also be used to estimate a level of illumination. This level of illumination may be used in various applications, one of which may be secure narrow beam communications between mobile devices. A secure means of communication between devices, devices and docking station, and people and their devices when they are in close proximity is important as it enables the use of a SPAD ranging module or device to transmit a modulated narrow beam of light to a further SPAD ranging module or device configured to receive the modulated narrow beam of light. The further SPAD ranging module may then demodulate and decode the data which could, for example, be a shared secret or cryptographic key suitable for encoding other communications and means of communications (for example, via a conventional cellular or WiFi data link) between the devices.

Thus unlike conventional RF communications, which are usually omnidirectional, by the use of narrow beams of light significantly reduce or prevent the interception and monitoring of the communications by third parties. Furthermore, the use of narrow beams of light ensures that the users of the devices know which device they are communicating with.

Another application area in which this reconfiguration of the SPAD pixel and array can be useful is LiDAR. In a LiDAR system it is advantageous to know the number of SPAD events within a given timing window in addition to their positioning in time.

The concept as embodied therein is therefore to use a minor modified SPAD pixel within a sensor array, where the modifications are only to the array routing or control of the pixel rather than changes to the architecture of the pixel. In implementing routing changes the embodied examples are highly compatible with existing SPAD pixel configurations.

Figure 1:
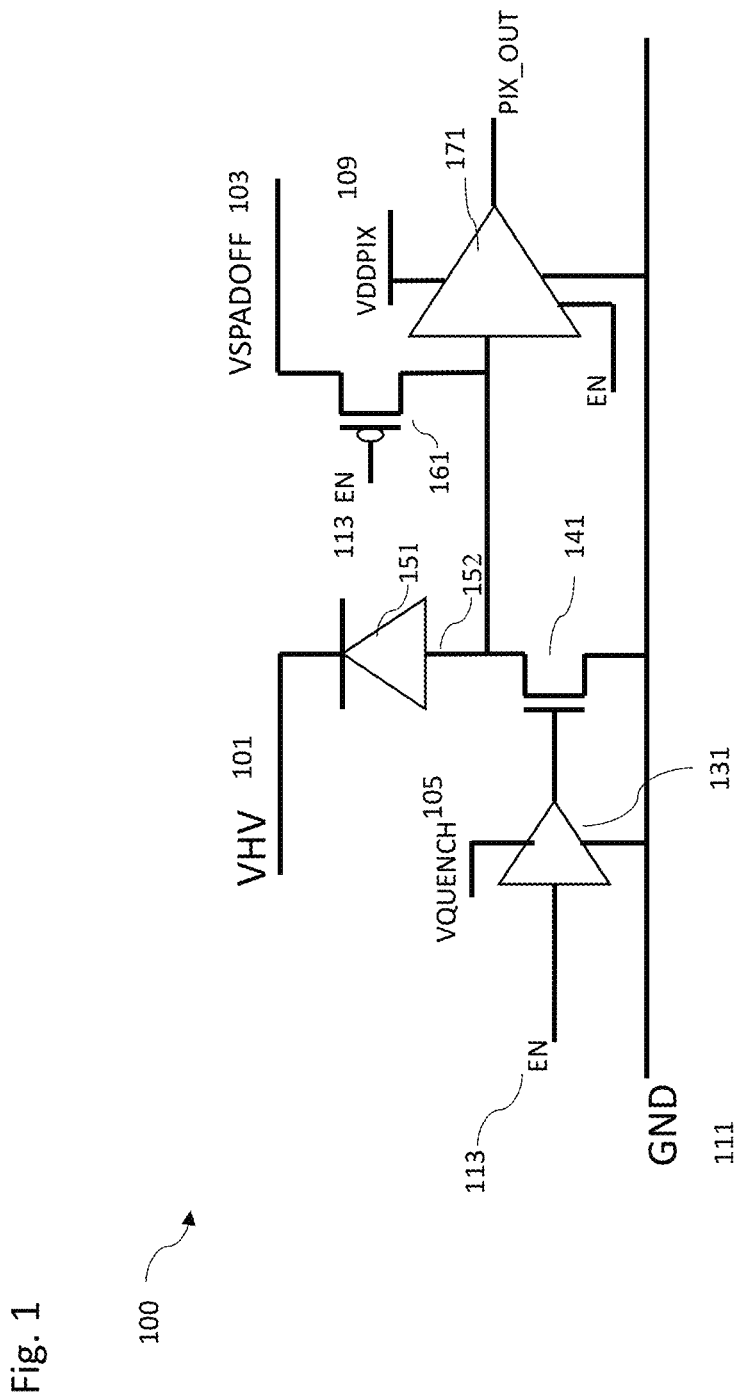
FIG. 1 shows a schematic view of a typical SPAD pixel configuration.

For example a conventional SPAD pixel configuration is shown with respect to FIG. 1. In this sample the pixel wo comprises a diode 151 which is reverse biased such that the diode cathode is coupled to a supply voltage 101. The supply voltage when the SPAD is operating to output a digital single photo detection event is a voltage VHV 101 which a potential higher than the reverse breakdown of the diode and allows the diode to operate in Geiger mode. Furthermore pixel wo comprises a quench transistor 141 configured to be selectively operated to 'quench' the avalanche created from the single photon event. The quench transistor 141 is shown as an n-channel MOS transistor is arranged with a drain coupled to an anode 152 of the diode 151 and a source coupled to a 'ground' voltage supply GND 111. The quench transistor 141 gate is shown being controlled by the enable EN signal input 113 which switches a quench voltage VQUENCH 105 via logic cell 131.

When the SPAD pixel is enabled the voltage of the anode 152 will be close to GND assuming there are no received photons or internally generated carriers. Thus for a time the diode will be biased beyond its breakdown voltage. Upon absorption of a photon the generated electron hole pair will trigger an avalanche multiplication in the diode. This will charge the anode 152 voltage very fast until the voltage drop across the diode reduces below breakdown and the avalanche current is 'quenched'. It is noted this method of quenching the breakdown is passive quenching. The anode 152 node voltage will then begin discharging back towards GND with the discharge current provided by the quench transistor 141. It is noted this method of re-arming the SPAD (biasing it beyond its breakdown voltage) is known as passive re-charging.

The pixel wo furthermore comprises a pull-up transistor 161. The pull-up transistor 161 is shown in FIG. 1 as a p-channel MOS transistor which is arranged such that the anode of the diode 151 is coupled to a drain of the p-channel MOS transistor 161, a source of the p-channel MOS transistor 161 is coupled to the off voltage VSPADOFF 103 and a gate of the p-channel MOS transistor 161 is coupled to the enable EN signal input 113.

Thus part of disabling a pixel is to reduce the voltage across the diode such that it no longer operates as a SPAD. Thus when the enable EN signal 113 is low the anode 152 will be connected to voltage VSPADOFF 103 which is sufficiently high to reduce the voltage across the diode below the breakdown voltage.

Furthermore the pixel 100 comprises an output logic stage configured to detect the photon event and generate an output pulse. The output stage shown in FIG. 1 is shown as a simple CMOS logic stage 171 with a supply voltage VDDPIX 109 and a ground connection GND. The logic stage 171 has an input connected to the diode anode 152 and an output connected to PIX_OUT. The logic stage also has an input from the enable EN signal 113.

An individual pixel can thus be disabled so the diode no longer operates as a SPAD and the digital output is disabled. In this configuration the pixel does not create unwanted load on the VHV SPAD supply and does not contribute any output to PIX_OUT and the following circuitry.

The concept employed herein in the following embodiments is one where a similar arrangement (or the same arrangement) to that shown in FIG. 1 is used but with different control signals to enable the pixel and the diode to output an analog signal. The embodiments as described herein enable the pixel to operate either as a photodiode device or as a SPAD device from which able to output an analog current or voltage which may be either in parallel with a digital event detection output with the same pixel or enable on a pixel by pixel or row by row (of pixels) basis a controllable digital photon event output or analog illumination level output.

For example in some embodiments by controlling an array such that some of the pixels operate in a SPAD digital event detection mode and some of the pixels operate in a level intensity detection mode a sufficient signals can be generated to enable both ranging information to be determined as well as detecting and decoding an optical data stream at the same time. Furthermore in such environments it is possible to detect where the received pulses are the same as the sent pulses and to further determine whether the ranging data is contaminated by any wraparound effect.

Figure 2:
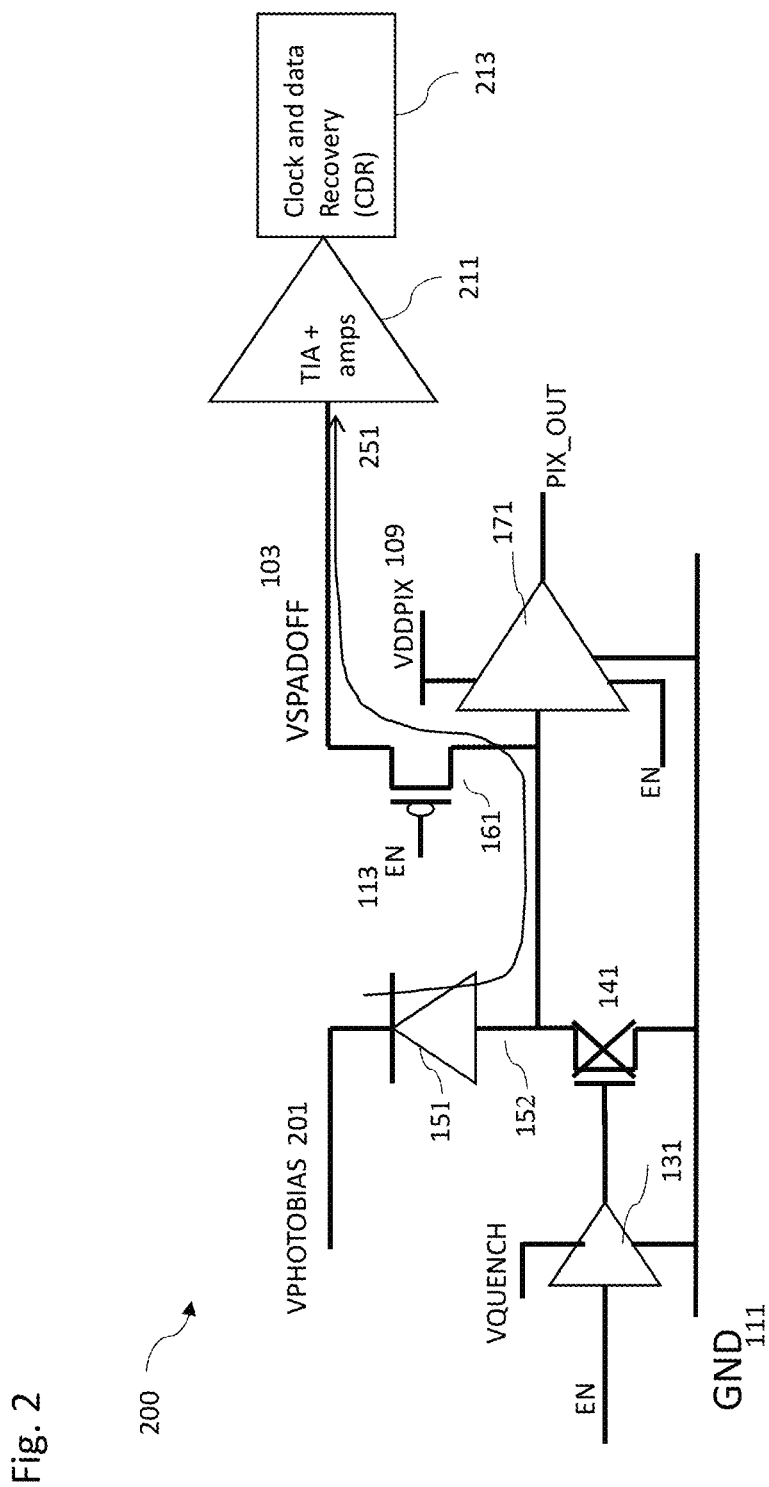
FIG. 2 shows a schematic view of a reconfigured SPAD pixel configured to operate as a photodiode or avalanche photodiode (APD) outputting an analog current according to some embodiments.

With respect to a first set of embodiments the diode is operated as a photodiode rather than a SPAD. For example FIG. 2 shows a modified pixel arrangement 200. The modified pixel arrangement differs from the pixel 100 shown in FIG. 1 in the following ways. Firstly in this mode of operation the supply voltage coupled to the cathode of the diode 151 is a voltage VPHOTOBIAS 201 which (for a given anode voltage) is below the level at which the diode would operate in Geiger mode. Depending on the voltage across the diode, it may operate as a simple photodiode or an avalanche photodiode (APD). For the case of an APD, received photons have a multiplying effect to the output photocurrent but full breakdown is not achieved.

The quench transistor 141 shown in FIG. 1 in this arrangement is disabled by controlling the VQUENCH voltage to be close to (or at) the GND voltage. Furthermore the output stage is disabled by setting the enable EN signal 113 to be close to (or at) the GND voltage. In the arrangement shown in FIG. 2 the pull-up transistor 161 is furthermore used as a pass transistor. The setting of the enable EN signal 113 to be close to (or at) the GND voltage enables the pull-up to pass the current generated by the diode 151 to the VSPADOFF node as shown by the routing 251.

In the example shown in FIG. 2 the VSPADOFF node is furthermore coupled to the input of a trans-impedance amplifier (TIA) 211 input. In other embodiments the VSPADOFF node may be coupled to any suitable input amplifier. A low input impedance is required to keep the VSPADOFF node voltage constant whilst the amplification required will be dependent on the magnitude of photocurrent which will flow.

The output of the trans-impedance amplifier 211 may then be passed or output to any suitable application. For example as shown in FIG. 2, where the illumination level detected is a received communications signal the output of the trans-impedance amplifier may be used as an input to a clock and data recovery circuit 213 where the illumination level value is synchronized and demodulated/decoded in order to determine the received data which was optically transmitted.

It is understood that other methods of sensing current can also be applied when operating in SPAD mode and sensing current (for example, such as shown later with respect to FIG. 10).

Furthermore the pass transistor may be an n-channel transistor with a suitable control signal rather than the p-channel transistor 161 shown in FIG. 2.

Figure 3:
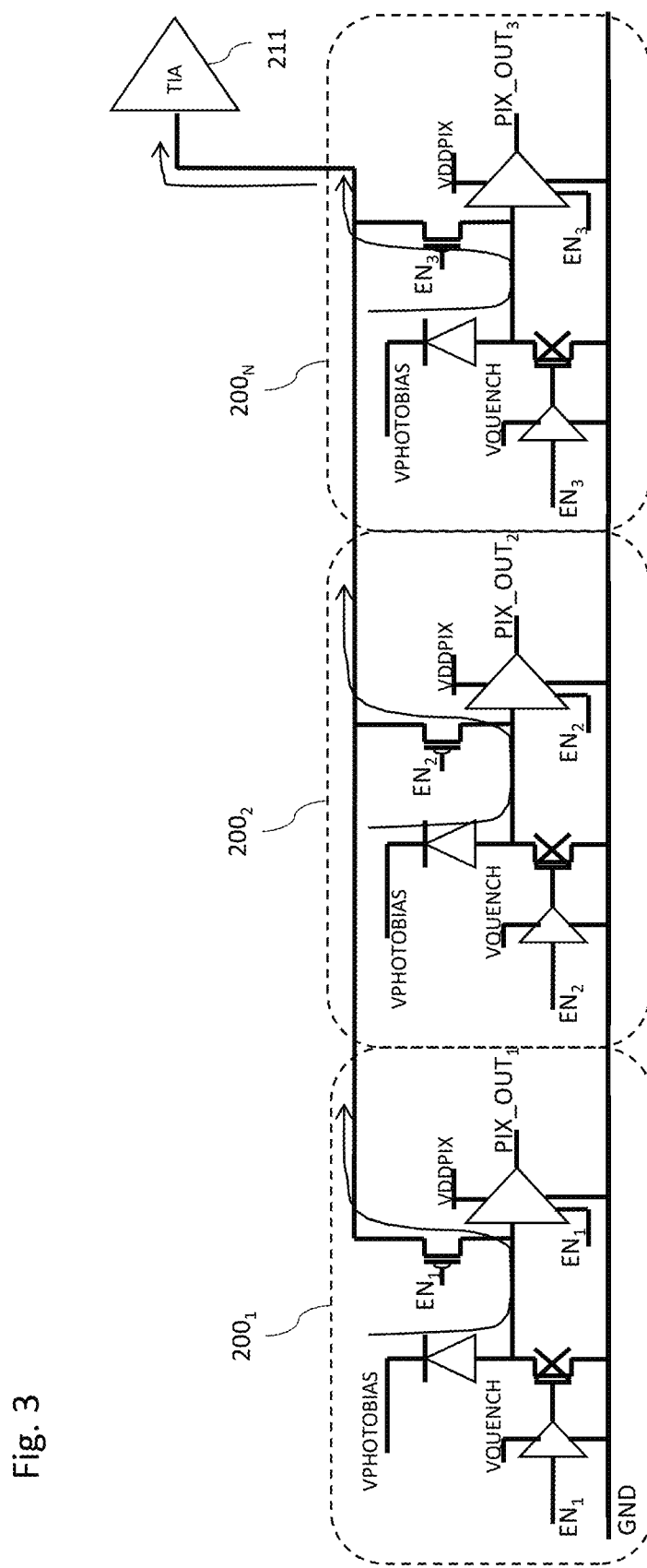
FIG. 3 shows a schematic view of a row of reconfigured SPAD pixels as shown in FIG. 2.

With respect to FIG. 3 an example is shown where a row of modified arrangement pixels 200 are shown where the analog current generated by each of the modified pixels $200_1$, $200_2$, $200_N$ may be combined at the input of the trans-impedance amplifier 211. In some embodiments it may be possible to selectively control the enable signal to each pixel in such a manner that individual pixels are enabled or disabled as required in order to maintain the output current to be within a defined input range for the trans-impedance amplifier 211.

It is understood that in some embodiments the modified pixels may be arranged or configured with a suitable feedback arrangement in order to attempt to cancel or allow for ambient light levels. In such embodiments the pixels may therefore output illumination level outputs which detect a change in illumination level and therefore detect communication light photons.

Figure 4B:
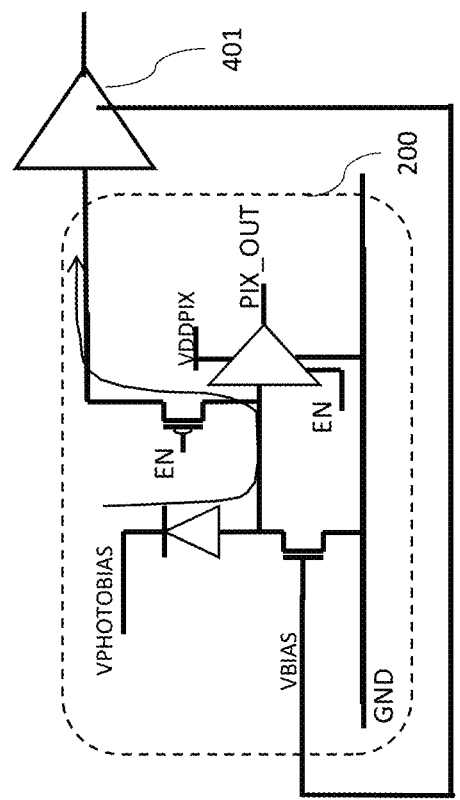
FIG. 4B shows a schematic view of an ambient light compensated reconfigured SPAD pixel where the compensation occurs within the pixel according to some embodiments.
Figure 4A:
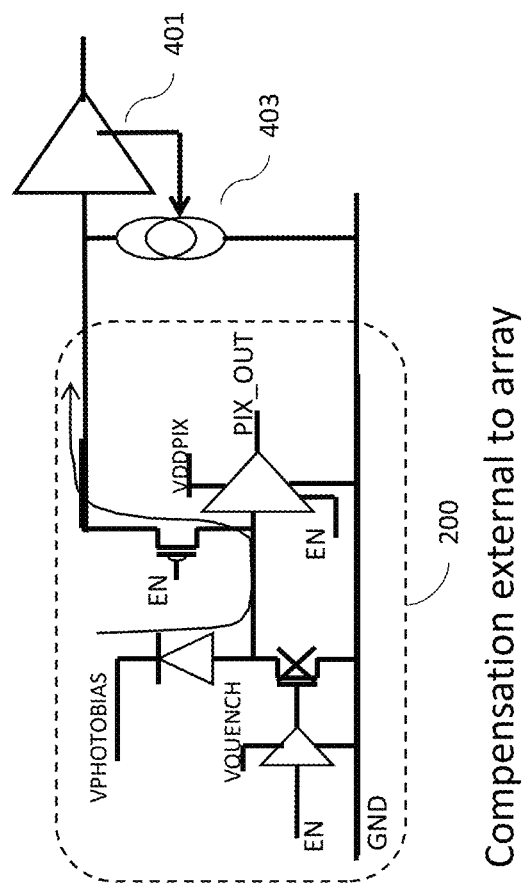
FIG. 4A shows a schematic view of an ambient light compensated reconfigured SPAD pixel where the compensation occurs outside of the pixel according to some embodiments.

For example with respect to FIG. 4A a first compensation arrangement is shown. In this example the compensation occurs external to the array wherein the pixel 200 output from the VANODE node is passed to current averager or ambient level determiner 401. The current averager/ambient level determiner 401 may comprise a trans-impedance amplifier and a low pass filter arrangement which is configured to generate a 'long-term' average output current value. This 'long-term' average output current value may be passed to a controllable current-source 403 which is arranged between the VSPADOFF node and the ground supply and configured to sink a 'long-term' average output current value and thus attempt to remove the ambient component from the output of the pixel before it is detected by the amplifier.

A similar arrangement may be made by implementing a low frequency signal feedback loop to the trans-impedance amplifier.

With respect to FIG. 4B a further compensation arrangement is shown where the compensation occurs within the pixel 200. In a manner similar to that shown in FIG. 4A the modified pixel 200 output from the VSPADOFF node is passed to current averager or ambient level determiner 401 configured to generate the 'long-term' average output current value. However the 'long-term' average output current value in this example is passed to the gate of the quench transistor 141 which attempts to remove the ambient current generated from the ambient light effect on the diode by sinking the ambient current.

Figure 5:
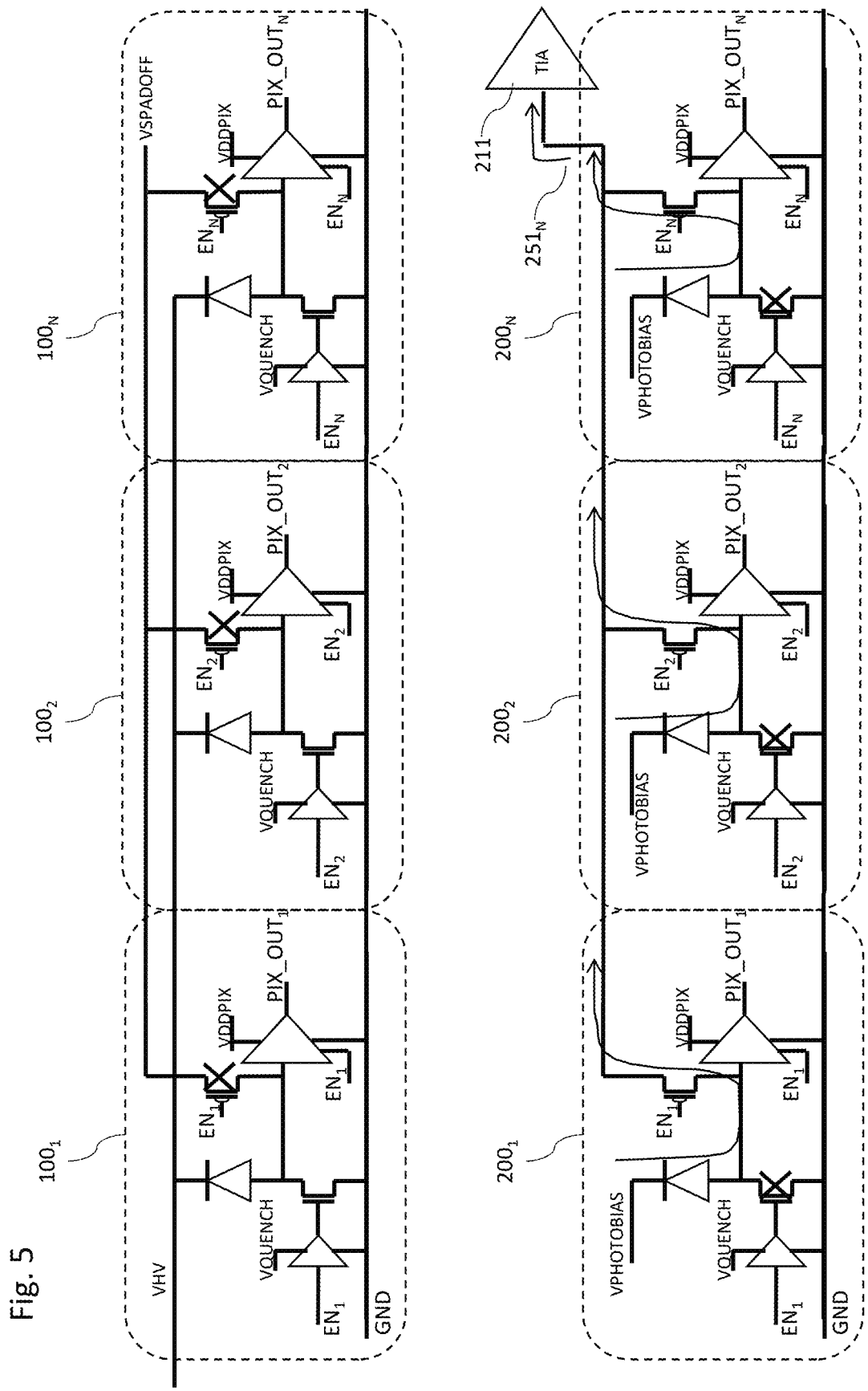
FIG. 5 shows a schematic view of two rows of reconfigurable pixels where a first row operates in a conventional SPAD output mode and a second row operates in the analog current photodiode output mode at the same time.

In some embodiments, such as shown in the example arrangement in FIG. 5 it is possible to configure an array of pixels to operate in both a SPAD single photon detection event mode and also in the analog level of illumination mode. For example a first row of pixels $100_1$, $100_2$, loom are configured to operate as a row of SPAD pixels. The first row of pixels are therefore arranged such that the cathodes of the diodes are coupled to the VHV 101 supply voltage and the quench transistor 141 is selectively operable, the pull-up transistor coupled to the VSPADOFF voltage supply (and at this point of time in the operation of the SPAD pixel disabled) and the output stage enabled in order to detect a breakdown event.

Furthermore the second row of pixels $200_1$, $200_2$, $200_N$ are configured to operate as a row of photodiode pixels. The second row of pixels are therefore arranged such that the cathodes of the diodes are coupled to the VPHOTOBIAS 201 supply voltage, the quench transistor 141 is disabled, the output stage disabled and the pull-up transistor is coupled to the VSPADOFF node and thus sums the outputs $251_1$, $251_2$, $251_N$ from the pixels $200_1$, $200_2$, $200_N$ respectively and which is input to the trans-impedance amplifier 211.

In the examples shown above the analog output is provided by the pixel diode being operated in a photodiode mode. However, operation of the diode in Geiger mode can produce a current which is many times larger than current when the diode is operated as a photodiode. It should be noted that the current generated from operation in SPAD mode is not fully continuous in time as each detected event required the avalanche current to be quenched and the diode re-biased. However, in some applications such as those that use pulsed light sources, this operation is fully compatible. Thus in some embodiments the pixels may be arranged such that the current from an array of SPAD pixels are summed in order to determine information about the instantaneous illumination levels. The sensing and summing current from the SPAD pixels may be implemented, for example, by reconfiguring the quench transistor such that the source is coupled to an output node. In such a way it may be possible to operate the array as an optical receiver. Thus as described previously the modified arrangement of the pixels achieve high sensitivity and furthermore are compatible with existing arrangements and architectures for standard SPAD and Time of flight detection applications.

Figure 6:
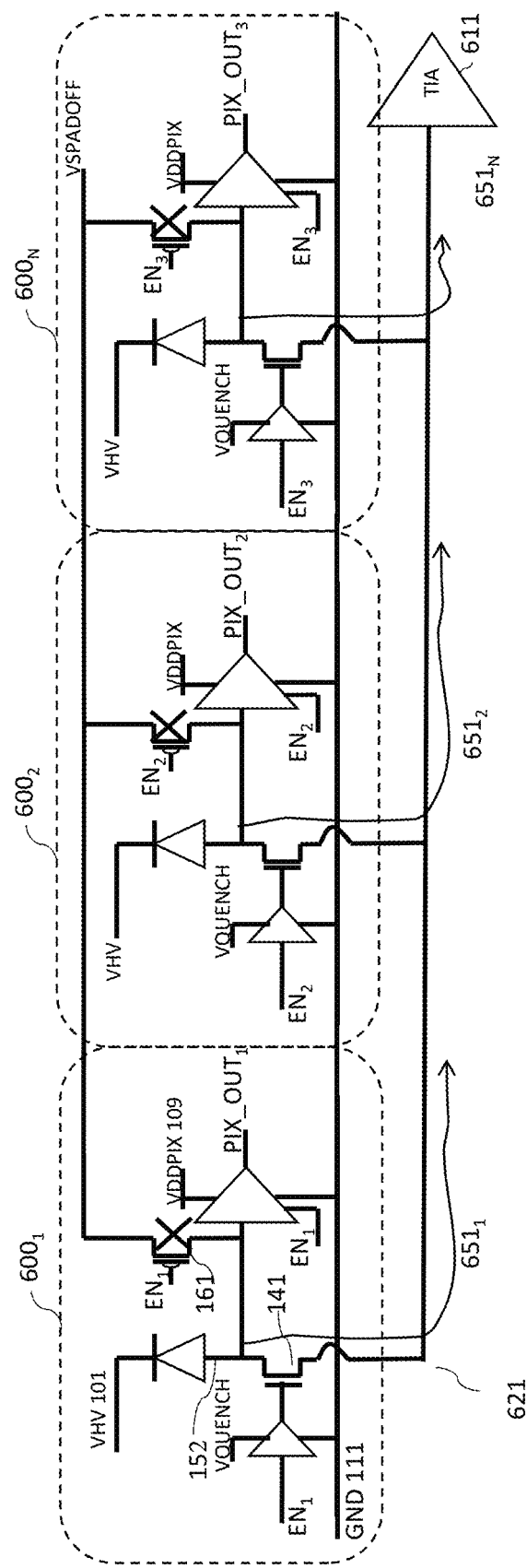
FIG. 6 shows a schematic view of a further arrangement of a row of reconfigured SPAD pixels configured to output an analog current associated with the recharge of a SPAD diode operating in Geiger mode according to some embodiments.

An example of a modified arrangement pixel 600 configured to output an analog signal representing level of illumination when the diode is operated in Geiger mode is shown in FIG. 6. The difference between the configuration or architecture of these modified pixels, shown as pixels $600_1$, $600_2$, and $600_N$ in FIG. 6 compared to the modified pixels 200 shown, for example, in FIG. 2 is that the quench transistor 141 requires a separate dedicated ground line 621 in order to sink the current from the photodiode caused by the diode breakdown current.

The dedicated ground line 621 or output line for the diode and quench current caused may be input to a trans-impedance amplifier 611 or other low impedance input amplifier stage such that the trans-impedance amplifier 611 'see' the combination of currents $651_1$, $651_2$, $651_N$, generated from the pixels $600_1$, $600_2$, and $600_N$ respectively.

Figure 7:
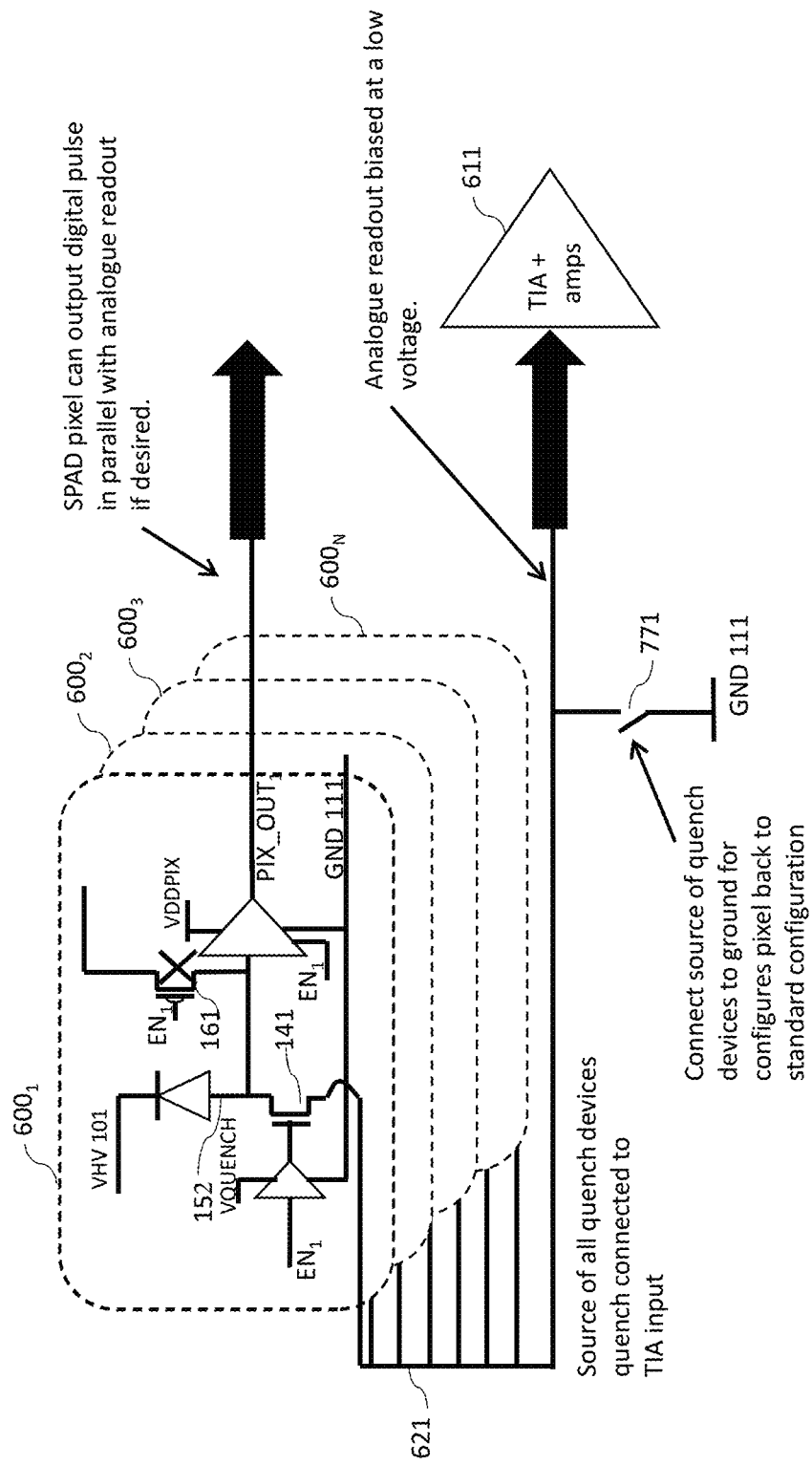
FIG. 7 shows a schematic view of a row or array of reconfigured SPAD pixels as shown in FIG. 6 configured to output both analog current and digital photon detection pulse at the same time according to some further embodiments.

With respect to FIG. 7 an example embodiment is shown where each modified pixel $600_1$, $600_2$, $600_3$, and $600_N$ is arranged such that the pixel can output a digital output from the output stage in parallel with an analog readout from the dedicated ground line 621 or output line for the quench current caused by the SPAD breakdown by coupling the source of the quench transistors/devices to the input of the trans-impedance amplifier input. The analog readout is biased at a low voltage and has a low impedance.

The analog readout line 621 can be connected by means of a switch 771 (likely a NMOS transistor) to the ground GND 111 and the pixel configuration will be the same as shown in FIG. 1.

Figure 8:
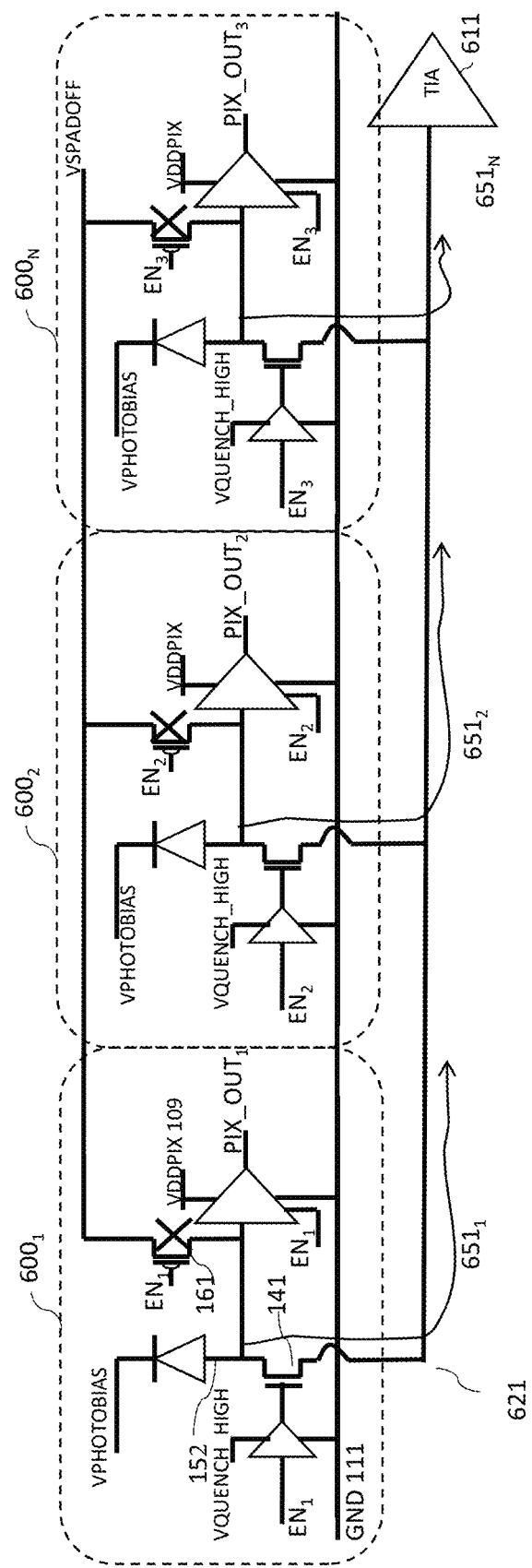
FIG. 8 shows a schematic view of a further arrangement of a row or reconfigured pixels as shown in FIG. 6 but with a further modification to show the SPAD cathode is biased with voltage VPHOTOBIAS and the quench voltage is increased to a higher voltage VQUENCH_HIGH.

With respect to FIG. 8 an example embodiment is shown where the diodes operate as photodiodes (biased below their breakdown voltage) and the quench transistor 141 is configured as a pass device. In such a configuration the quench voltage can be adjusted to reduce the resistance of the pass device. This is labelled as VQUENCH_HIGH in FIG. 8.

When considering the current summation at the trans-impedance input it is understood that the current generated by a SPAD 'event' is not a square pulse output. As mentioned previously, the quench and re-charge operations described in these embodiments is of a passive nature. FIG. 9A shows a typical profile for the anode 152 voltage and the current through the quench device 141 when an event triggers the avalanche breakdown of the diode. The anode 152 exhibits a fast charging up to a level which reduces the voltage drop across the diode to below breakdown. The increased voltage between the source and drain of the quench transistor 141 will cause a current to flow to GND 111 through the quench device. This current will discharge the anode back to GND. As the current flowing between drain and source of the quench transistor is dependent on the voltage, the quench current will reduce as the anode voltage drops.

Figure 9B:
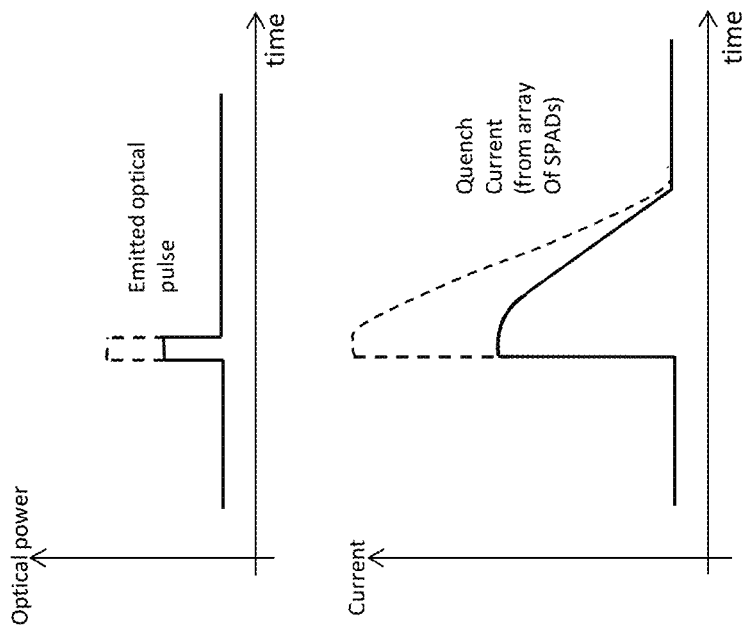
FIG. 9B shows a plot of quench current generated from an array of SPAD pixels as shown in FIGS. 6 to 9A for an incident optical pulse of varying intensity.
Figure 9A:
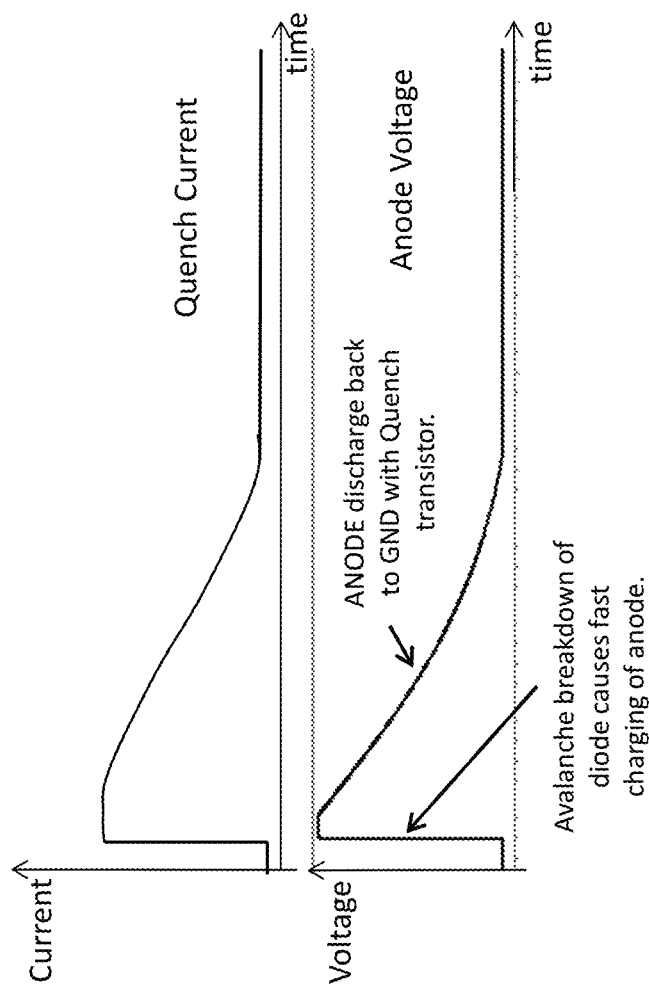
FIG. 9A shows a typical voltage and current response curve of a SPAD pixel operating in Geiger mode which would be found in the reconfigured SPAD pixel as shown in FIGS. 6 to 8.

FIG. 9B shows an example of how an optical pulse with different intensities can provide a similarly varying quench current. It also shows how the intensity can be sensed in a short time window. FIG. 9B plots quench current from an array of SPADs over time compared with the power of the emitted optical pulse.

For the scenario where the pixel is configured to operate as a SPAD receiver it can be desirable to modify the profile of output current from that which is shown in FIG. 9A. For example, in the embodiments discussed, if the SPAD cathode voltage VHV is modified, it will have an impact on the quench current that is sensed. Similarly, if the background incident illumination is high (ambient), SPADs may not be fully re-biased before the next event is triggered. Again, this will have an impact on the quench current which is sensed. In an application where knowing the number of parallel events is important, reducing the variation of the received current per event is desirable.

Figure 10:
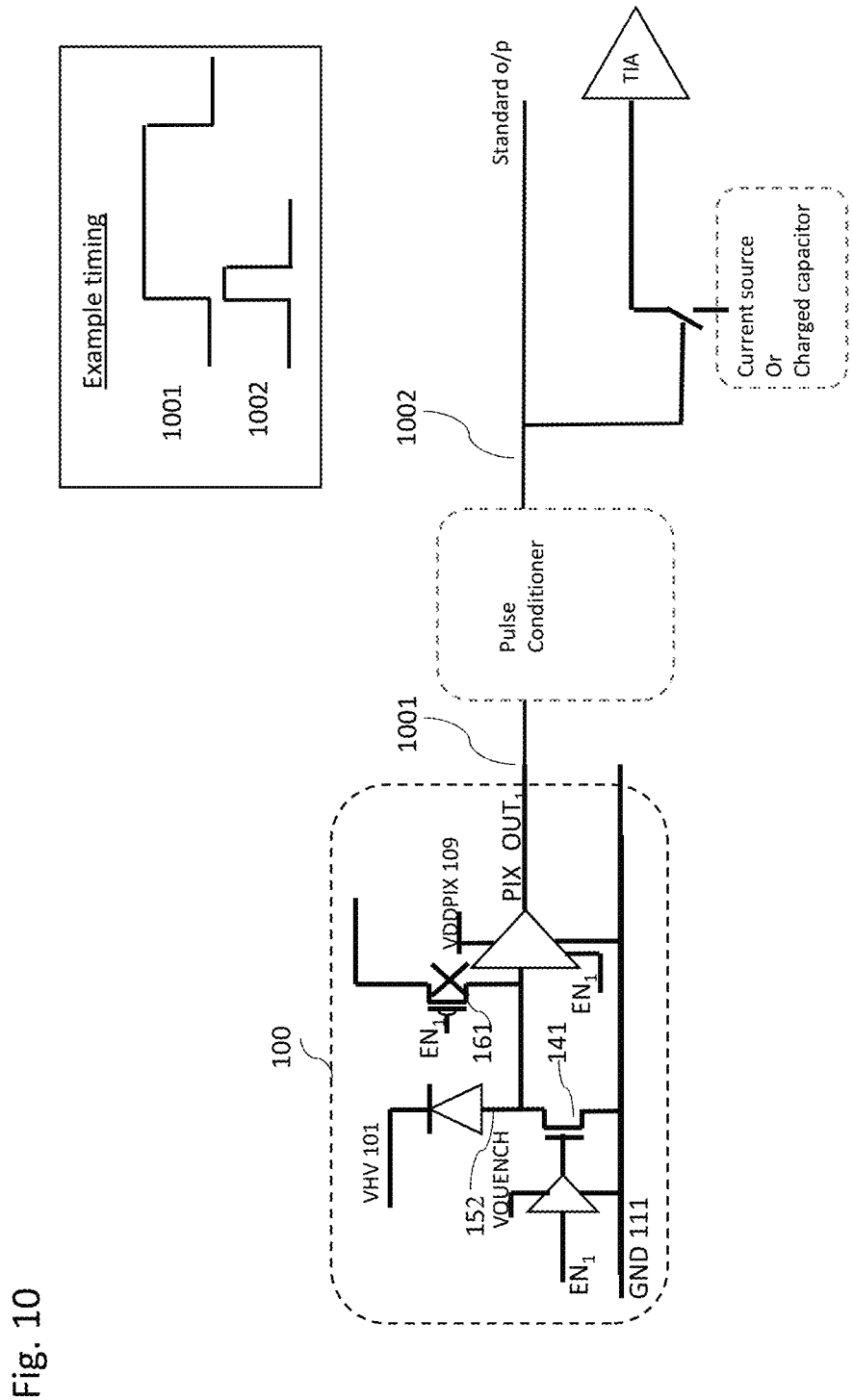
FIG. 10 shows a schematic view of a SPAD pixel with output circuitry configured to generate a controlled analog output associated with a SPAD event from the given pixel.

FIG. 10 shows and embodiment in which the standard digital output pulse from the SPAD pixel is used to generate an input to the TIA sense block. The SPAD pixel output 1001 will be a digital pulse with a width relative to the quench time of the SPAD pixel. A pulse conditioner can be used to shorten the width of the digital pulse so that it is no longer relative to the re-charge time (dead time) of the SPAD pixel. The output of the pulse conditioner block 1002 can now be used to generate an input to the TIA sense circuitry which has less variability due to changes in parameters such as the VHV voltage and the SPAD dead time. The magnitude and width of the pulse provided to the TIA can also be designed independently to the SPAD pixel.

It has been mentioned that the embodiments described refer to a passive quench and re-charge of the SPAD. An alternate method of quench and re-charge well detailed in the literature is active quenching and active re-charging. These methods change the internal circuitry of a SPAD pixel (normally adding mode devices). One possible advantage is that one can obtain a reduction in the re-charge time by using active re-charge circuitry. This could reduce the SPAD dead time and make it available sooner to detect further incoming photons. A circuit modification to implement an active re-charge will not change the compatibility with the current sensing scheme proposed in the discussed embodiments.

The standard readout from an array of SPAD pixels scan can be done in a number of different ways. At one extreme every SPAD pixel can provide a unique digital output which can be detected in parallel. This is very possible for small array sizes but becomes more difficult as the array size increases. Routing congestion and the interface to the detection circuitry are two problems for a fully parallel readout. At the other extreme the array of SPAD pixels could have a single output with some circuitry being embedded in the array to perform the combination. A similar partitioning of the analog readout can also be implemented if desired.

Figure 11B:
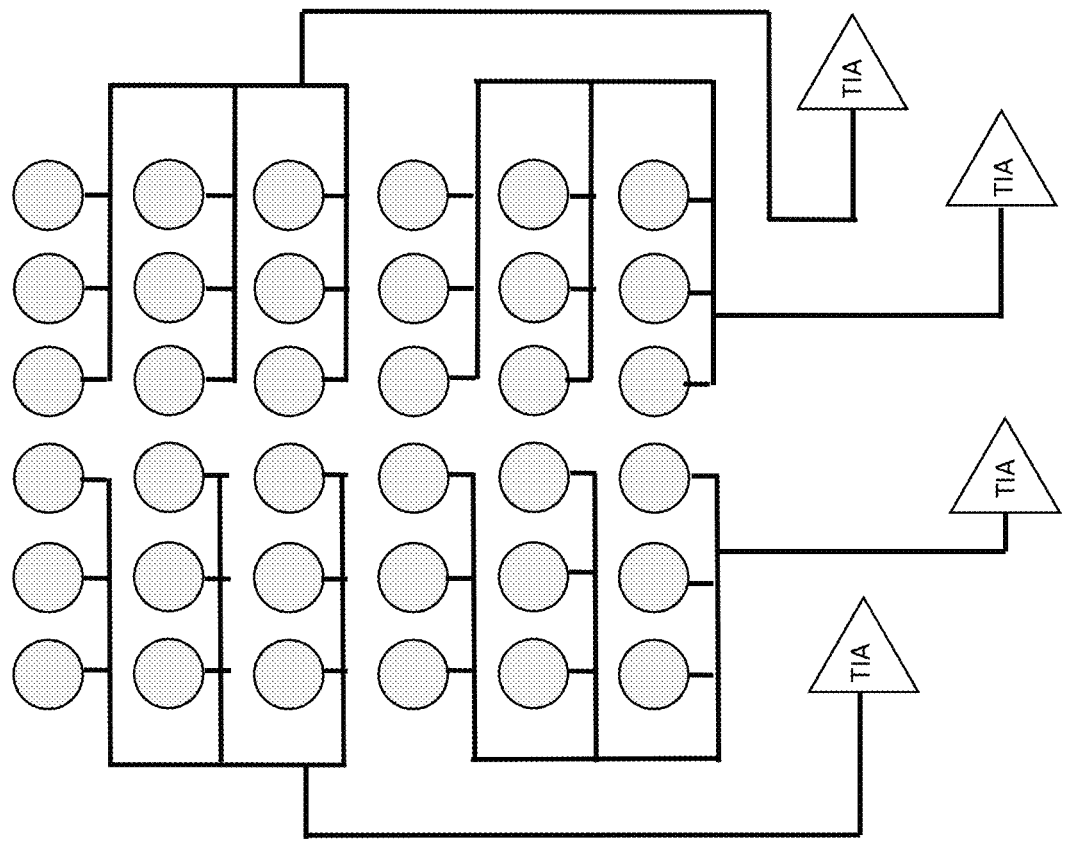
FIGS. 11A and 11B show schematic views showing some example configurations of how the SPAD or photodiode pixels could be configured with one or more TIA sense circuits.
Figure 11A:
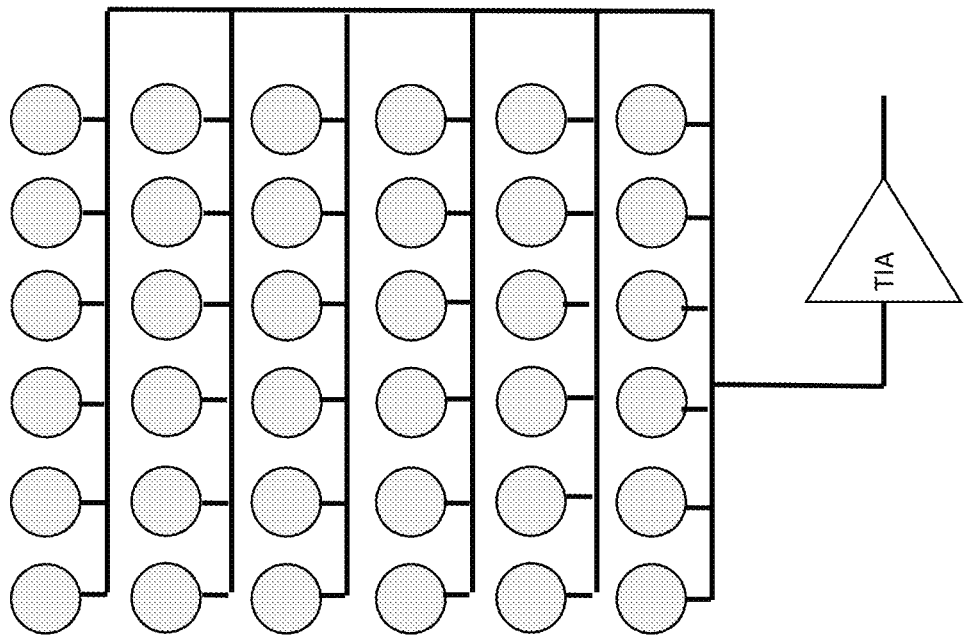

Two example embodiments are shown in FIG. 11A and FIG. 11B. FIG. 11A shows an array of SPADs with a single analog readout whereas FIG. 11B shows a SPAD array with more than one distinct analog output. Multiple analog output channels may be aligned to distinct imaging areas as required by the optical design of the system or application.

In some embodiments the sensing of the current per SPAD event may be made via any other suitable supply. For example, the TIA sensing circuit could be connected to the VDDPIX supply which connects to the pixel output logic stage. Similarly the GND connection of the output logic stage could be configured as the analog output sense node. Furthermore, in some embodiments the supply line VHV may be sensed to determine a current passing through the photodiode based on a SPAD event in the photodiode.

It should be appreciated that the above described arrangements may be implemented at least partially by an integrated circuit, a chip set, one or more dies packaged together or in different packages, discrete circuitry or any combination of these options.

Various embodiments with different variations have been described here above. It should be noted that those skilled in the art may combine various elements of these various embodiments and variations.

Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

What is claimed is:

1. An apparatus comprising:
a single photon avalanche diode pixel comprising a single photon avalanche diode and output transistor circuitry configured to provide an analog output current from the single photon avalanche diode, wherein the output transistor circuitry comprises:
a quench transistor coupled to an anode of the single photon avalanche diode, and
a pull-up transistor coupled to the anode of the single photon avalanche diode;
wherein the single photon avalanche diode pixel is configured to operate in a first mode to output a digital single photon detection event;
wherein the single photon avalanche diode pixel is further configured to operate in a second mode to output the analog output current indicating a level of illumination of the single photon avalanche diode pixel;
wherein the output transistor circuitry is configured to provide the analog output current to an input of a trans-impedance amplifier, the input of the trans-impedance amplifier coupled to the anode of the single photon avalanche diode; and
wherein:
in the first mode, the pull-up transistor is off, and
in the second mode, the quench transistor is off and the pull-up transistor is on.

2. The apparatus as claimed in claim 1, wherein the single photon avalanche diode is configured to operate in the first mode and second mode at different times or at substantially the same time.

3. The apparatus as claimed in claim 1, wherein the apparatus comprises a plurality of multiple single photon avalanche diode pixels having a respective single photon avalanche diode, each respective single photon avalanche diode configured to provide an analog output current to the input of the trans-impedance amplifier.

4. The apparatus as claimed in claim 1, further comprising a pulse conditioner coupled to receive a single photon detection event signal pulse and configured to control the output transistor circuitry to output the analog output current, which indicates the level of illumination of the single photon avalanche diode pixel based on a modified length single photon detection event signal pulse.

5. The apparatus as claimed in claim 1, further comprising a current averager configured to determine an average analog output current, wherein the average analog output current indicates an ambient level of illumination of the single photon avalanche diode pixel.

6. The apparatus as claimed in claim 5, wherein a gate of the quench transistor is coupled to the current averager.

7. The apparatus as claimed in claim 1, wherein the single photon avalanche diode is configured to operate in a Geiger mode of operation in the first mode and in a photodiode mode of operation in the second mode.

8. The apparatus as claimed in claim 1, wherein the quench transistor is configured to drain an avalanche current following a detection event; wherein the pull-up transistor is configured to enable a potential of the anode of the single photon avalanche diode to be pulled up to an further supply voltage; and wherein the output transistor circuitry further comprises an output transistor coupled to the anode of the single photon avalanche diode and configured to enable an output of the digital single photon detection event.

9. The apparatus as claimed in claim 1, wherein the quench transistor is configured to drain an avalanche current following a detection event, and wherein the quench transistor is selectively enabled when the single photon avalanche diode pixel is operated in the first mode.

10. The apparatus as claimed in claim 9, wherein the apparatus is configured so that a quench transistor gate terminal is operated at a high voltage to reduce an impedance of the output transistor circuitry when the quench transistor is selectively enabled.

11. The apparatus as claimed in claim 1, wherein the apparatus comprises a plurality of rows single photon avalanche diode pixels, wherein a first row is configured to operate in the first mode and a further row is configured to operate in the second mode at substantially the same time.

12. The apparatus as claimed in claim 1, wherein the trans-impedance amplifier is coupled to the anode of the single photon avalanche diode via the quench transistor.

13. The apparatus as claimed in claim 1, wherein the pull-up transistor is coupled between the anode of the single photon avalanche diode and the input of the trans-impedance amplifier.

14. A method for operating a single photon avalanche diode pixel that comprises a single photon avalanche diode and output transistor circuitry, the method comprising:
configuring the single photon avalanche diode pixel to operate in a first mode to output a digital single photon detection event by turning off a pull-up transistor of the output transistor circuitry, the pull-up transistor being coupled to an anode of the single photon avalanche diode; and
configuring the single photon avalanche diode pixel to operate in a second mode by:
turning off a quench transistor of the output transistor circuitry, the quench transistor being coupled to the anode of the single photon avalanche diode,
turning on the pull-up transistor, and
configuring the output transistor circuitry to provide an analog output current from the single photon avalanche diode indicating a level of illumination of the single photon avalanche diode pixel to an input of a trans-impedance amplifier, the input of the trans-impedance amplifier coupled to the anode of the single photon avalanche diode.

15. The method as claimed in claim 14, wherein providing the analog output current from the output transistor circuitry to the input of the trans-impedance amplifier comprises providing the analog output current from multiple single photon avalanche diode pixels to the input of the trans-impedance amplifier.

16. The method as claimed in claim 14, further comprising:
modifying a pulse length of a single photon detection event signal pulse; and
controlling the output transistor circuitry to output the analog output current indicating a level of illumination of the single photon avalanche diode pixel based on the modified pulse length of the single photon detection event signal pulse.

17. An apparatus for operating a single photon avalanche diode pixel that comprises a single photon avalanche diode and an output transistor circuitry, the apparatus comprising:
means for configuring the single photon avalanche diode pixel to operate in a first mode to output a digital single photon detection event by turning off a pull-up transistor of the output transistor circuitry, the pull-up transistor being coupled to an anode of the single photon avalanche diode; and
means for configuring the single photon avalanche diode pixel to operate in a second mode by:
turning off a quench transistor of the output transistor circuitry, the quench transistor being coupled to the anode of the single photon avalanche diode,
turning on the pull-up transistor, and
configuring the output transistor circuitry to provide an analog output current from the single photon avalanche diode indicating a level of illumination of the single photon avalanche diode pixel to an input of a trans-impedance amplifier, the input of the trans-impedance amplifier coupled to the anode of the single photon avalanche diode.

18. The apparatus of claim 17, further comprising:
means for modifying a pulse length of a single photon detection event signal pulse; and
means for controlling the output transistor circuitry to output the analog output current to indicate a level of illumination of the single photon avalanche diode pixel based on the modified pulse length of the single photon detection event signal pulse.

19. The apparatus of claim 17, further comprising means for compensating for an ambient level of illumination of the single photon avalanche diode pixel by removing an average analog output current from the analog output current such that the level of illumination of the single photon avalanche diode pixel is an indication of the level of illumination above the ambient level of illumination of the single photon avalanche diode pixel.

20. An apparatus comprising:
a plurality of rows of single photon avalanche diode pixels, each single photon avalanche diode pixel comprising a single photon avalanche diode and respective output transistor circuitry configured to provide an analog output current from the respective single photon avalanche diode, wherein each output transistor circuitry comprises: a respective quench transistor coupled to an anode of the respective single photon avalanche diode, and a respective pull-up transistor coupled to the anode of the respective single photon avalanche diode, wherein the single photon avalanche diode pixels are arranged as sets of single photon avalanche diode pixels, wherein each single photon avalanche diode pixel is configured to operate in a first mode to output a digital single photon detection event, wherein, in the first mode, the respective pull-up transistor is off, and wherein each single photon avalanche diode pixel is further configured to operate in a second mode to output the analog output current indicating a level of illumination of the single photon avalanche diode pixel, wherein, in the second mode, the respective quench transistor is off and the respective pull-up transistor is on; and
a plurality of trans-impedance amplifiers, each trans-impedance amplifier having an input coupled to receive the analog output current from each single photon avalanche diode pixel of a respective one of the sets of single photon avalanche diode pixels, wherein each trans-impedance amplifiers is respectively coupled to anodes of single photon avalanche diodes of single photon avalanche diode pixels.

21. The apparatus as claimed in claim 20, wherein a first set of the single photon avalanche diode pixels is configured to operate in the first mode and a further set of the single photon avalanche diode pixels is configured to operate in the second mode at substantially the same time.

22. The apparatus as claimed in claim 20, wherein a first row of the single photon avalanche diode pixels is configured to operate in the first mode and a further row of the single photon avalanche diode pixels is configured to operate in the second mode at substantially the same time.

* * * * *